(12) United States Patent
Harada et al.

(10) Patent No.: US 7,358,118 B2
(45) Date of Patent: Apr. 15, 2008

(54) MOUNTING METHOD OF FLEXIBLE PRINTED CIRCUIT AND MANUFACTURING METHOD OF ELECTRIC OPTICAL DEVICE

(75) Inventors: Mitsuaki Harada, Chino (JP); Soichi Moriya, Chino (JP); Takeo Kawase, Suwa (JP); Atsushi Miyazaki, Fujini-machi (JP)

(73) Assignee: Seiko Epson Corporation (JP)

( * ) Notice: Subject to any disclaimer, the term of this patent is extended or adjusted under 35 U.S.C. 154(b) by 433 days.

(21) Appl. No.: 11/189,048

(22) Filed: Jul. 26, 2005

(65) Prior Publication Data
US 2006/0023154 A1    Feb. 2, 2006

(30) Foreign Application Priority Data
Jul. 29, 2004    (JP)    ............... 2004-222060

(51) Int. Cl.
| | |
|---|---|
| H01L 21/50 | (2006.01) |
| H01L 21/48 | (2006.01) |
| H01L 21/44 | (2006.01) |
| H01L 23/52 | (2006.01) |
| H01L 23/48 | (2006.01) |
| H01L 29/40 | (2006.01) |

(52) U.S. Cl. ............... 438/119; 438/118; 438/610; 438/617; 257/784; 257/785

(58) Field of Classification Search ............... 438/118, 438/119, 610, 617; 257/784, 785
See application file for complete search history.

(56) References Cited

U.S. PATENT DOCUMENTS 6,089,442 A * 7/2000 Ouchi et al. ............ 228/180.1
6,527,162 B2 * 3/2003 Totani et al. ............ 228/175
6,613,599 B2 * 9/2003 Imaeda ...................... 438/30

FOREIGN PATENT DOCUMENTS

| JP | 07-209663 | 8/1995 |
|---|---|---|
| JP | 2001-291738 | 10/2001 |
| JP | 2003-318407 | 11/2003 |

OTHER PUBLICATIONS

Communication from Japanese Patent Office regarding counterpart application.

* cited by examiner

*Primary Examiner*—Luan Thai
(74) *Attorney, Agent, or Firm*—Harness, Dickey & Pierce, P.L.C.

(57) ABSTRACT

Aspects of the current invention are directed to a method of mounting a flexible printed circuit and a manufacturing method of an electric optical device. Each of the methods form semiconductor elements and first terminal portions for electrically connecting the semiconductor elements and the outside of the board. These terminal portions have are completely or partially covered with an organic film 37 and are pressed into second terminal portion on the flexible printed circuit from the direction above the organic film thereby creating an electrical connection. Optionally, an anisotropic conductive paste or anisotropic conductive film may be provided between the second terminal portion and the organic film.

8 Claims, 3 Drawing Sheets

MOUNTING METHOD OF FLEXIBLE PRINTED CIRCUIT AND MANUFACTURING METHOD OF ELECTRIC OPTICAL DEVICE

RELATED APPLICATION INFORMATION

This application claims priority to Japanese application no. 2004-222060, filed Jul. 29, 2004, whose contents are expressly incorporated herein by reference.

FIELD OF INVENTION

Aspects of the invention relate to a mounting method of a flexible printed circuit and a manufacturing method of an electric optical device.

BACKGROUND OF INVENTION

Recently, electric optical devices have been developed such as liquid crystal devices, organic EL devices and electrophoresis devices. For example, as described in Japanese Unexamined Patent Publication No. 2001-291738, liquid crystal devices are generally structured with a liquid crystal panel, having a board on which a thin-film transistor is formed, being connected to a flexible printed circuit containing, for example, IC chips, which may drive the liquid crystal panel. In electric optical devices having this kind of liquid crystal device, generally the process of connecting a board and a flexible printed circuit includes removal of a protective organic film covering the terminal of the board by photolithography or etching. Generally, a flexible printed circuit is then positioned with an anisotropic conductive film or anisotropic conductive paste between the terminal of the board and the terminal of the flexible printed circuit being connected to the terminal of the board. The terminal of the board and the terminal of the flexible printed circuit can then be connected by heating the anisotropic conductive film or the anisotropic conductive paste while pressurizing the flexible printed circuit.

SUMMARY OF THE INVENTION

Removal of the organic film by photolithography or etching generally adds a process to connect the flexible printed circuit to the board and generally requires a large-scale device such as a vacuum device, which increases production cost. Some aspects of the present invention provide a mounting method for flexible printed circuits during manufacturing of electric optical devices that simplify the removal of the organic film covering the terminals of the board, thereby reducing production costs.

Some aspects of the present invention solve the above-described problem by mounting a flexible printed circuit on a non-flexible board provided with semiconductor elements by electrically connecting the semiconductor elements to the outside of the board using first terminal portions with an organic film covering the first terminal portions. In some of the aspects of the present invention, second terminal portions on the flexible printed circuit are generally pressed toward the first terminal portions by applying pressure from the direction above the organic film and are connected to the first terminal portions when the organic film breaks. Accordingly, some of the aspects of the present invention provide a method of mounting the flexible printed circuit on the board without requiring the step of removing the organic film using photolithography or etching and therefore reducing the number of processing steps and associated production costs. In some other aspects of the invention, the board comprising the semiconductor elements is also flexible, and the overall method produces a flexible product.

Other aspects of the present invention utilize the above method along with providing an anisotropic conductive paste or anisotropic conductive film between the second terminal and the organic film. According to these aspects of the invention, the conductive fine particles, provided in the anisotropic conductive paste or the anisotropic conductive film, are harder than the organic film covering the first terminal. When the flexible printed circuit is pressurized, the conductive fine particles enhance the capability of opening of holes in the organic film and provide an interface to contact the first terminal portions, thus permitting electrical conductivity between the first terminal portions and the second terminal portions through the conductive fine particles.

Other aspects of the present invention use a semiconductor element that is generally comprised of an organic thin layer transistor. In the aspects of the present invention where the semiconductor comprises an organic thin film transistor, the semiconductor layer can become a channel region generally formed from the organic film. The semiconductor layer according to some aspects of the invention can be formed by any method known to those of ordinary skill in art including, for example, spin coating. In the aspects of the present invention where the semiconductor layer is formed to cover the first terminal portions of the board, the mounting method allows the second terminal portions of the flexible printed circuit to conduct to the first terminal portions without removing the semiconductor layer on the first terminal portions. Accordingly, production cost and number of production processes can be reduced.

BRIEF DESCRIPTION OF THE DRAWINGS

Aspects of the invention will be described with reference to the accompanying drawings, wherein like numbers reference like elements.

DETAILED DESCRIPTION OF THE INVENTION

Hereinafter, an illustrative embodiment for putting the present invention into practice is described with reference to the accompanying drawings. It is noted that various connections are set forth between elements in the following description. It is noted that these connections in general and, unless specified otherwise, may be direct or indirect and that this specification is not intended to be limiting in this respect.

Figure 1:
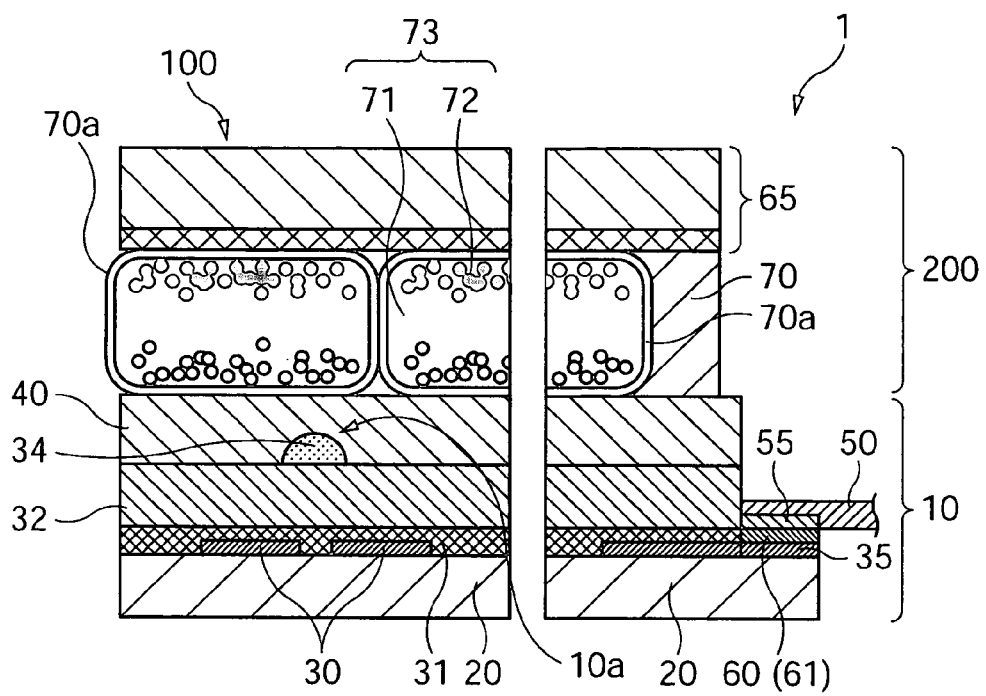
FIG. 1 is an electrophoresis device obtained by a manufacturing method according to some aspects of the present invention.

FIG. 1 shows an embodiment of an electric optical device manufactured using a mounting method of flexible printed circuit according to some aspects of this invention. Electrophoresis device 1 is provided with an electrophoresis panel 100 and a flexible printed circuit 50 (Flexible Printed Circuit, hereinafter, abbreviated as FPC) on which a drive circuit (not shown) to drive this electrophoresis panel 100 may be formed. The electrophoresis panel 100 may comprise an electrophoresis portion 200 and a rectangular circuit board 10. The FPC50 may be connected to the electrophoresis panel 100 through an anisotropic conductive film 60 (hereinafter, abbreviated as ACF) or anisotropic conductive paste 61 (hereinafter, abbreviated as ACP).

Figure 2:
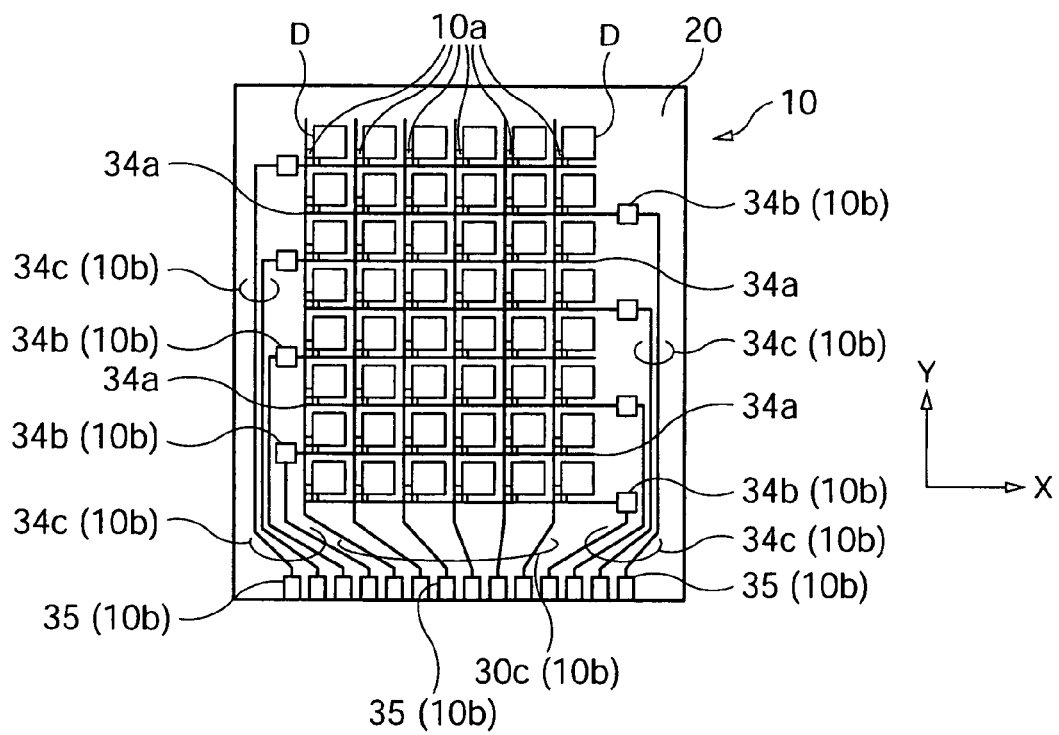
FIG. 2 is an elevation view of a circuit board according to some aspects of the present invention.
Figure 3:
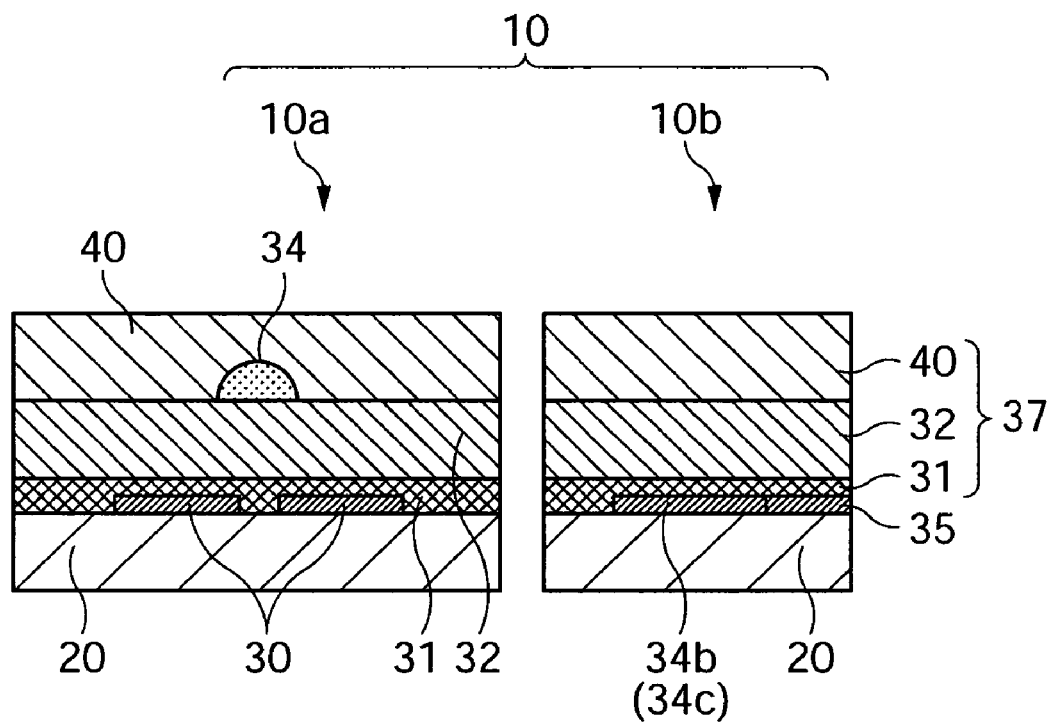
FIG. 3 is a cross section of a primary part of the circuit board according to some aspects of the present invention.

FIG. 2 is an elevation view an embodiment a circuit board 10 used in aspects of the present invention and FIG. 3 is a schematic cross section of a primary part of a circuit board 10 that may be connected to FPC 50 in some aspects of the present invention. Circuit board 10 may have a plurality of organic thin film transistors or semiconductor elements 10*a*, gate lines 34*a* and pixel electrodes D generally on a center portion of a base board. Preferably, the base board used in some aspects of the present invention is rectangular in shape, although other geometric shaped base boards known to those of ordinary skill may be used in some aspects of the present invention (including but not limited to squares, circles, and multi-sided shapes). Generally, gate line connecting portions 34*b* connect to the gate lines 34 and may be formed and placed on outer circumferential portions 10*b* along the longitudinal direction of a base board 20. Gate line leading lines 34*c* generally connect to gate line connecting portions 34*b* and external connecting terminal portions 35. External connecting terminal portions 35 may also be connected to source line leading lines 30*c*. External connecting terminal portions 35 may be terminals for connecting circuit board 10 and FPC 50.

As shown in FIG. 3, base board 20 may comprise circuit board 10 and can be constructed of materials generally known to those of skill in the art, including but not limited to transparent and non-transmitting materials. Preferably, circuit board 10 is constructed of a flexible material, such as plastic or other flexible materials known to those of ordinary skill in the art to provide flexibility to circuit board 10. Even more preferably, circuit board 10 is constructed from polycarbonate. In aspects of the invention where circuit board 10 may be flexible, the resulting electrophoresis panel 100 having this board may also be flexible and electrophoresis device 1 as a whole may also be flexible even when the FPC 50 is mounted.

Organic thin film transistors 10*a* may be structured in any way known to those of ordinary skill in the art. Preferably, organic thin film transistors 10*a* can be structured to layer source and drain electrodes 30, a semiconductor layer 31, insulation layer 32, gate electrode 34 and protective film 40 on the base board 20, to yield a top-gate structured transistor. In aspects of the invention using top-gate structured transistors, the semiconductor layer 31, the insulation film 32 and the protective film 40 are preferably formed of organic materials.

As seen in FIG. 2, pixel electrodes D are generally provided in correspondence with organic thin film transistors 10*a*. Pixel electrodes D also are generally connected to drain electrodes 30 through contact holes (not shown). Further, the pixel electrodes D may be extended from the drain electrodes 30.

As shown in FIG. 2, the gate lines 34*a* are generally wires connecting gate electrode 34 and gate lines connecting portions 34*b*. Generally, gate lines 34*a* are wires formed by any method known to those of ordinary skill in the art. Preferably, gate lines 34*a* are wires formed by the droplet discharging or ink jet method. Gate line connecting portions 34*b* generally may be terminals that connect gate lines 34*a* and gate line leading lines 34*c*. Gate line leading lines 34*c* may be wires or other connecting means known to those of ordinary skill in the art, that connect gate connecting portions 34*b* and external connecting terminal portions 35. Generally, gate line leading lines 34*c* may be integrated to provide high precision line width.

As seen in FIG. 3, gate electrode 34 generally may be structured so it is connected to gate line connecting portions 34*b* through gate lines 34*a*, and electrically connected to external connecting terminal portions 35 using gate line connecting portions 34*b* and/or gate line leading lines 34*c*.

Generally, external connecting terminal portion 35 may be formed from layers including a semiconductor layer 31, an insulation film 32, and a protective film 40. Preferably, external connecting terminal portion 35 may be covered with an organic film 37 which itself comprises a semiconductor layer 31, an insulation film 32, and a protective film 40. Generally, the thickness of the semiconductor layer 31 and insulation film 32 are sufficient to perform their respective functions according to some aspects of the invention. Preferably, the thickness of semiconductor layer 31 is between about 10 to about 100 nm and the thickness of insulation film 32 that may be formed on semiconductor layer 31 is from about 500 to about 2000 nm. Generally, organic film 37 (which may comprise semiconductor layer 31, insulation film 32 and protective film 40) can be formed by any method known to those of ordinary skill in the art. Preferably, organic film 37 is formed by the spin coat method. Even more preferably, semiconductor layer 31 of organic film 37 may be formed by ink jet method.

As shown in FIG. 1, an electrophoresis portion 200 may comprise an oppositely facing board 65 provided to oppositely face circuit board 10 and at least one electrophoresis layer 70 between boards 10 and 65. Generally, electrophoresis layer 70 may have one or more microcapsules 70*a*. Preferably, each microcapsule 70*a* is formed of resin film and is about 1 pixel in size. Preferably, the plurality of the microcapsules 70*a* are arranged to cover all of the displaying regions. Even more preferably, the plurality of microcapsules 70*a* are arranged so that each microcapsule 70*a* close-contacts adjacent microcapsules to reduce the area of the displaying regions not being covered with at least on microcapsule 70*a*.

Generally, microcapsule 70*a* may have sealed within an electrophoresis disperse liquid 73 having disperse medium 71 and electrophoresis particles 72 or other similar materials known to those of ordinary skill in the art. Electrophoresis disperse liquid 73 and electrophoresis disperse particles 72 are generally dispersed in dye-colored disperse medium 71. Electrophoresis disperse particles 72 are generally spherical fine particles, whose diameters are from about approximately 0.01 μm to 10 μm, and may be composed of one or inorganic oxides or inorganic hydrates as single particles or with surface reforms. Preferably, the inorganic oxides and hydrates provide a hue to electrophoresis disperse particle 72 that differs from the hue of disperse medium 71. Preferably, electrophoresis particles 72 use inorganic oxides and inorganic hydrates selected from one or more of the following: titanium dioxide; zinc oxide; magnesium oxide; colcothar; aluminum oxide; black titanium suboxide; chrome oxide; boehmite; FeOOH; silicon dioxide; magnesium hydroxide; nickel hydroxide; ziruconium oxide; and copper oxide. If electrophoresis particles 72 have surface reforms, these surface reforms are generally the provision of a coating treatment, a coupling treatment, and/or a method of graft polymerization. Preferably, coating treatments include applying a polymer to the surface of the particle using any method known to those of ordinary skill in the art. Even more preferably, the polymer in the coating treatment is an acrylic resin, an epoxy resin, a polyester resin, or polyurethane resin. Preferably coupling treatments are performed using any of the methods known to those of skill in the art and use silan, titanate, or aluminum and fluoride base as a coupling agent. Preferably, graft polymerization is performed by any method known to those of ordinary skill in the art and used an acrylic monomer, a styrene monomer, an epoxy monomer or an isocyanate monomer. The selection of different inorganic oxides or inorganic hydrates with or without surface reforms is a design choice for those of ordinary skill in the art, so that electrophoresis disperse particles 72 generally have a specific surface isoelectric point where a the surface electric charge density may vary with the hydrogen ion index pH of disperse medium 71.

Surface isoelectric point is a state expression where the algebraic sum of the electric charge of an amphoteric electrolyte in aqueous solution and the hydrogen ion index pH is zero. For example, if a pH of disperse medium 71 equals the surface isoelectric point of electrophoresis particles 72, the effective electric charge of the particles becomes zero and the particles do not react to an external electric field. Further, if the pH of disperse medium 71 is lower than the surface isoelectric point of the particles, the surface of the particle becomes positively charged by following equation (1). Contrarily, if the pH of disperse medium 71 is higher than the surface isoelectric point of the particles, the surface of the particle becomes negatively charged by following equation (2).

M–OH+H+(Excessive)+OH– → M-OH2++OH–   (1)

M-OH+H++OH–(Excessive) → M-OH– → M–+H+   (2)

Additionally, when a difference between the pH of the disperse medium 71 and the surface isoelectric point of the particles is increased, electric charge quantity of the particles increases according to the reacting equations (1) and (2). However, when the difference exceeds a value that depends on the type, size and shape of the particle, the charge quantity is generally saturated and does not change even if the pH is changed to above the value. Regardless of the type, size or shape of the particle, if the value is above about 1, those of ordinary skill in the art generally think that the electric charge quantity is saturated.

Disperse medium 71 may generally contain one or more non-aqueous organic solvents such as hydrocarbons, halogen hydrocarbons, ethers, or other similar non-organic solvents known to those of ordinary skill in the art. The non-aqueous organic are generally colored with dyes such as spirit black, oil yellow, oil blue, oil green, very first blue, macrorex blue, oil brown, sudan black, first orange, or other dyes well known to those of ordinary skill in the art so that disperse medium 71 has a hue different from that of the electrophoresis particles 72.

As shown in FIG. 1, FPC 50 may be a board provided with a driver circuit such as IC chip or other circuit known to those of ordinary for driving the organic thin film transistor 10a of the circuit board 10. Preferably the board of FPC 50 is composed of a polyimid. Generally, FPC 50 drives the organic thin film transistor 10a by supplying power to source line of the circuit board 10 and supplying drive signal to the gate line 34a. Additionally, a terminal 55 that may be connected to external connecting terminal portion 35 of circuit board 10 is formed on FPC 50. ACF 60 or ACP 61 may also be provided between the external connecting terminal portion 35 and terminal 55.

ACF 60 may generally have conductive fine particles dispersed within. ACF 60 (and ACP 61) is generally pressurized so that the conductive fine particles are continuously arranged within thus providing an electrical connection between external connecting terminal portion 35 and terminal 55 through at least the continuous conductive fine particles. Generally ACF 60 may be constructed as an insulating resin adhesive sheet with a conductivity in the axial direction along its thickness and an insulating capability in the surface direction. Generally, the conductive fine particles may be formed of conductive substances such as metals. Preferably, the conductive fine particles are formed from silver, gold, copper, nickel, carbon and combinations thereof. ACP 61 is generally a paste like substance containing an insulating resin and conductive fine particles dispersed in therein. The insulating sheet of ACF 60 or the insulating resin of ACP 61 is generally composed of a thermosetting resin or other similar compound known to those of ordinary skill that solidifies after fusion, and may bond the external connecting terminal portion 35 of circuit board 10 and terminal 55 of FPC 50. FPC 50 may be connected using either ACF 60 or ACP 61, depending on specific design parameters.

An illustrative embodiment of aspects of the invention directed to a method of mounting the FPC 50 on the electrophoresis panel 100 and a method of manufacturing the electrophoresis device 1 will be described with reference to FIG. 4. In this embodiment, FPC 50 may be mounted on the electrophoresis panel 100. While one of ordinary skill will understand that thickness of organic film 37, semiconductor layer 31, insulating film and protective film may generally be about the ranges provided above for some aspects of the invention, the present embodiment preferably has an organic film 37 thickness of about 2650 nm which may be formed on the external connecting terminal portion 35. The organic film 37 of this embodiment is preferably formed of a 50 nm thick semiconductor layer 31, a 1600 nm thick insulating film, and a 1000 nm thick protective film.

Generally, when mounting FPC 50, it is necessary to either temporarily bond ACF 60 on terminal 55 or external connecting terminal portion 35, or use ACP 61. In this embodiment, ACF 60 is temporarily bonded by heating and pressurizing ACF 60 onto terminal 55 of FPC 50. Preferably, the temperature used for temporarily bonding ACF is from about 40° C. to about 60° C., and even more preferably about 55° C. Additionally, the pressure to bond ACF 60 to terminal 55 is generally from about 20 to about 40 kg/cm², and preferably about 30 kg/cm². Heat and pressure are generally applied for a sufficient time to create the bond. Preferably, the bonding time required to create the temporary bond is from about 2 to about 10 seconds, and even more preferably about 3 seconds. Alternatively, temporary bonding may be accomplished between ACF 60 and terminal portion 35 using adhesive tape or adhesive techniques known to those of ordinary skill.

Figure 4A:
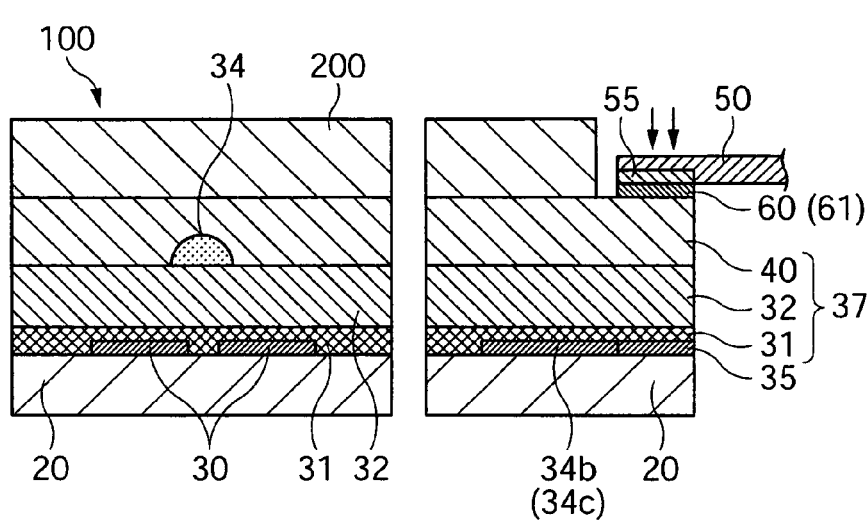
FIGS. 4(a), (b) and (c) are schematic process explanations of the mounting method according to some aspects of the present invention.

As shown in the illustrative example in FIG. 4(a), generally, FPC 50 may be positioned so that terminal 55 formed in FPC 50 is immediately above external connecting terminal portion 35, which may be formed in circuit board 10. Accordingly, ACF 60 may be provided between terminal 55 and external connecting terminal portion 35, and FPC 50 can be placed above external connecting terminal portion 35 through ACF 60 and organic film 37. While FPC 50 is pressurized toward external connecting terminal portion 35 along the direction shown in FIG. 4(a), ACF 60 may be heated and crimped to electrophoresis panel 100. Generally, crimping conditions are sufficient to secure a temporary bond between ACF 60 and electrophoresis panel 100. Preferably, the crimping temperature is from about 130° C. to about 160° C., and more preferably at about 155° C. The pressure is preferably from about 20 to about 40 kg/cm², and more preferably about 30 kg/cm². The crimping time is preferably from about 2 to about 10 seconds, and more preferably about 3 seconds.

Figure 4B:
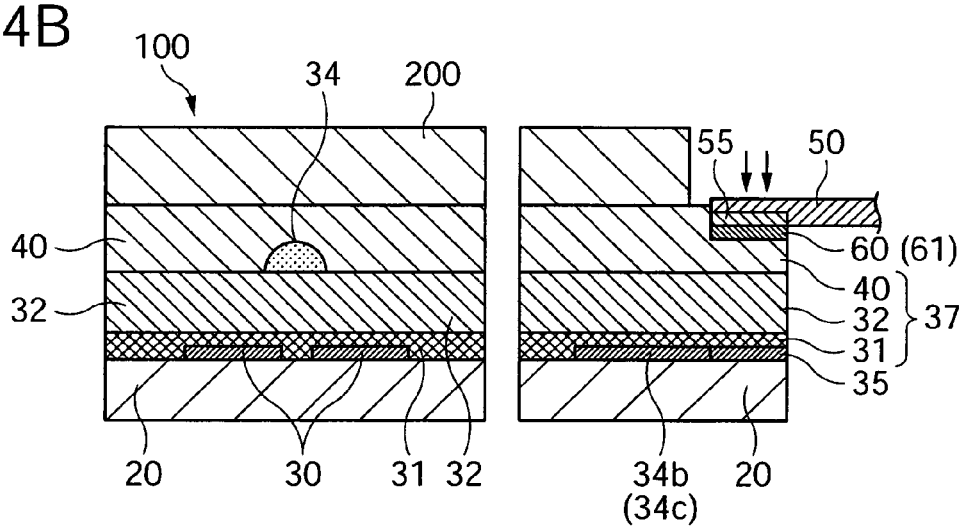
Figure 4C:
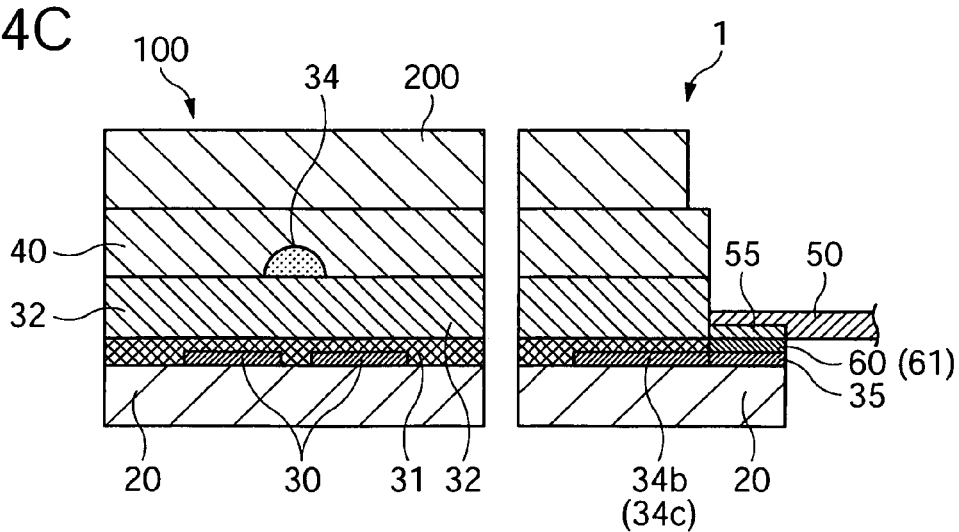

As described in detail above, ACF generally contains conductive fine particles formed from conductive metallic material or other similar materials known to those of ordinary skill. Preferably, the conductive fine particles are formed of a harder material than materials that may be present in organic film 37. As shown in FIG. 4(b), when FPC 50 is pressurized through ACF 60, the conductive fine particles make holes so as to push and open organic film 37 resulting in FPC 50 contacting terminal 55 through the continuous conductive fine particles in the ACF 60 which contact both the external connecting terminal portion 35 and terminal 55, as shown in FIG. 4(c). 1331 Additionally, between external connecting terminal portion 35 and terminal 55, organic film 37 is opened by the conductive fine particles with pressure from above the FPC 50 providing mixing conditions for the conductive fine particles and resin within the ACF 60 and organic film 37, so when ACF 60 is heated, the adhesive sheet may be fused and solidified, thereby bonding external connecting terminal portion 35 and terminal 55 through a continuity status maintained by the conductive fine particles. This process can result with FPC 50 mounted on the electrophoresis panel 100, leading to manufacture of electrophoresis device 1 where conductivity generally can be established between terminal 55 of electrophoresis panel 100 and external connecting terminal portion 35 without removing organic film 37 and eliminating the need to remove organic film by either photolithography or etching processes and reducing the associated production steps and costs of electrophoresis device 1.

Additional aspects of the present invention provide for use of organic thin film transistor 10a as a semiconductor element and semiconductor layer 31 thereby may become a channel region formed by organic film. Accordingly, when the semiconductor layer 31 is formed by spin coat method or other similar methods known to those of ordinary skill, the semiconductor layer 31 may be formed to cover external connecting terminal portion 35 of electrophoresis panel 100. Other aspects of the present invention can be utilized to create a connection between terminal 55 of the FPC 50 and external connecting terminal portion 35 without removing the semiconductor layer 31 on external connecting terminal portion 35, thus reducing processing steps and the associated costs.

Further, those skilled in the art will appreciate that there are numerous variations and permutations of the above described embodiments of the present invention. It is to be understood that other embodiments may be utilized and structural and functional modifications may be made without departing from the scope of the present invention. Thus, the spirit and scope of the invention should be construed as broadly as set forth in the appended claims. For example, some aspects of the invention use polycarbonate as a material in baseboard 20, it will be a matter of design choice to those of ordinary skill to use similar materials in baseboard 20, including, but not limited to, polyethylene naphthalate (PEN), polyethylene terephthalate (PET), polyimid, or the material used in FPC 51. Further, in one embodiment of some aspects of the invention, a top gate structure preferentially described. However, as should be apparent to those of ordinary skill, some aspects of the present invention may be used with either top or bottom gate structures.

Similarly, one embodiment of some aspects of the invention described above may have used semiconductor layer 31 formed on base board 20 as organic thin film transistor 10a. Those of ordinary skill should recognize that even when the inorganic thin film transistor is formed on the board, continuity can be established by many methods including, but not limited to, embodiments wherein the upper of the wiring pad or similar device connected to drive IC is covered with organic film. Further, one embodiment of some aspects of the invention provided for a method for manufacturing electrophoresis display device 1 by crimping the FPC 50 to the electrophoresis panel 100. Those of ordinary skill should recognize that electrophoresis device 1 may also be manufactured according to other aspects of the invention by providing electrophoresis panel 100 after crimping FPC 50 to circuit board 10.

What is claimed is:

1. A method of mounting a flexible printed circuit on a board provided with a semiconductor element with a first terminal portion electrically connecting the semiconductor element to an outside surface and an organic film covering the first terminal portion, comprising:
    pressuring a second terminal portion on the flexible printed circuit toward the first terminal portion from above the organic film; and
    connecting the second terminal portion to the first terminal portion by pushing and breaking the organic film.

2. A method of manufacturing an electric optical device, comprising:
    forming semiconductor element with a first terminal portion electrically connected to the semiconductor element and to the outside of a board, wherein the first terminal portion has an organic film covering; and
    pressuring a second terminal portion on a flexible printed circuit toward the first terminal portion from above the organic film, until the first and second terminal portions form a conductive path.

3. The method according to claim 2, anisotropic conductive paste or anisotropic conductive film being provided between the second terminal portion and the organic film.

4. The method of claim 2, the semiconductor element being an organic transistor.

5. The method of claim 3, the semiconductor element being an organic transistor.

6. The method of claim 2, wherein the board is flexible.

7. The method of claim 3, wherein the board is flexible.

8. The method of claim 4, wherein the board is flexible.

* * * * *